United States Patent
Guo et al.

(10) Patent No.: US 11,201,116 B2
(45) Date of Patent: Dec. 14, 2021

(54) SEMICONDUCTOR DEVICE HAVING INTER-METAL DIELECTRIC PATTERNS AND METHOD FOR FABRICATING THE SAME

(71) Applicant: United Semiconductor (Xiamen) Co., Ltd., Fujian (CN)

(72) Inventors: Bin Guo, Singapore (SG); Hailong Gu, Singapore (SG); Chin-Chun Huang, Hsinchu County (TW); Wen Yi Tan, Fujian (CN)

(73) Assignee: United Semiconductor (Xiamen) Co., Ltd., Fujian (CN)

(*) Notice: Subject to any disclaimer, the term of this patent is extended or adjusted under 35 U.S.C. 154(b) by 0 days.

(21) Appl. No.: 16/843,903

(22) Filed: Apr. 9, 2020

(65) Prior Publication Data
US 2021/0242129 A1 Aug. 5, 2021

(30) Foreign Application Priority Data
Feb. 4, 2020 (CN) .......................... 202010079602.6

(51) Int. Cl.
*H01L 23/528* (2006.01)
*H01L 21/768* (2006.01)
*H01L 23/522* (2006.01)
*H01L 21/321* (2006.01)

(52) U.S. Cl.
CPC .... *H01L 23/5283* (2013.01); *H01L 21/76802* (2013.01); *H01L 21/76877* (2013.01); *H01L 23/5226* (2013.01); *H01L 21/3212* (2013.01); *H01L 21/7684* (2013.01); *H01L 21/76843* (2013.01)

(58) Field of Classification Search
CPC ........... H01L 23/5283; H01L 21/76802; H01L 23/5226; H01L 21/76877; H01L 21/76843; H01L 21/7684; H01L 21/3212
See application file for complete search history.

(56) References Cited

U.S. PATENT DOCUMENTS

| | | | |
|---|---|---|---|
| 6,613,592 B1 | 9/2003 | Chen et al. | |
| 7,089,522 B2 | 8/2006 | Tan et al. | |
| 8,890,084 B1 | 11/2014 | Guo et al. | |
| 2021/0082747 A1* | 3/2021 | Mignot | .............. H01L 21/0245 |

* cited by examiner

*Primary Examiner* — Karen Kusumakar
(74) *Attorney, Agent, or Firm* — Winston Hsu

(57) ABSTRACT

A method for fabricating semiconductor device includes the steps of first forming a first inter-metal dielectric (IMD) layer on a substrate, patterning the first IMD layer to form first IMD patterns on the substrate, a trench surrounding the first IMD patterns, and a second IMD pattern surrounding the trench, forming a metal layer in the trench to surround the first IMD patterns, forming a second IMD layer on the first IMD patterns, the metal layer, and the second IMD pattern, and forming via conductors in the second IMD layer. Preferably, the via conductors not overlapping the first IMD patterns.

9 Claims, 7 Drawing Sheets

SEMICONDUCTOR DEVICE HAVING INTER-METAL DIELECTRIC PATTERNS AND METHOD FOR FABRICATING THE SAME

BACKGROUND OF THE INVENTION

1. Field of the Invention

The invention relates to a method for fabricating semiconductor device, and more particularly to a method of using patterning process to form inter-metal dielectric (IMD) patterns and patterned metal layer.

2. Description of the Prior Art

As device dimensions continue to shrink, a reduction in interconnect line widths leads to increased line resistance (R) for signals. Further, reduced spacing between conducting lines creates more parasitic capacitance (C). The result is an increase in RC signal delay, which slows chip speed and lowers chip performance.

The line capacitance, C, is directly proportional to the dielectric constant, or k-value of a dielectric material. A low-k dielectric reduces the total interconnect capacitance of the chip, reduces the RC signal delay, and improves chip performance. Lowering the total capacitance also decreases power consumption. The use of a low-k dielectric material in conjunction with a low-resistance metal line provides an interconnect system with optimum performance for the ULSI technology. For this reason, prior art attempts to reduce the RC delays have focused on utilizing material with a low-k to fill the gaps between the metal lines.

Nevertheless, a difference in stress often arises between lower level metal interconnections and IMD layers made of low-k dielectric material during fabrication of semiconductor devices. Typically, tensile stress is more likely to be generated between lower level metal interconnections while compressive stress is likely to be generated for IMD layers. This unbalance between different stresses ultimately creates cracks particularly in dense regions of via conductors and affects the performance of the device significantly. Hence how to resolve this issue has become an important task in this field.

SUMMARY OF THE INVENTION

According to an embodiment of the present invention, a method for fabricating semiconductor device includes the steps of first forming a first inter-metal dielectric (IMD) layer on a substrate, patterning the first IMD layer to form first IMD patterns on the substrate, a trench surrounding the first IMD patterns, and a second IMD pattern surrounding the trench, forming a metal layer in the trench to surround the first IMD patterns, forming a second IMD layer on the first IMD patterns, the metal layer, and the second IMD pattern, and forming via conductors in the second IMD layer. Preferably, the via conductors not overlapping the first IMD patterns.

According to another aspect of the present invention, a semiconductor device includes a patterned metal layer on a substrate, via conductors on the patterned metal layer, and first inter-metal dielectric (IMD) patterns embedded in the patterned metal layer. Preferably, the first IMD patterns are between and without overlapping the via conductors in a top view.

According to yet another aspect of the present invention, a semiconductor device includes a patterned metal layer on a substrate, first inter-metal dielectric (IMD) patterns embedded in the patterned metal layer, and via conductors on the patterned metal layer. Preferably, the via conductors not overlapping the first IMD patterns.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
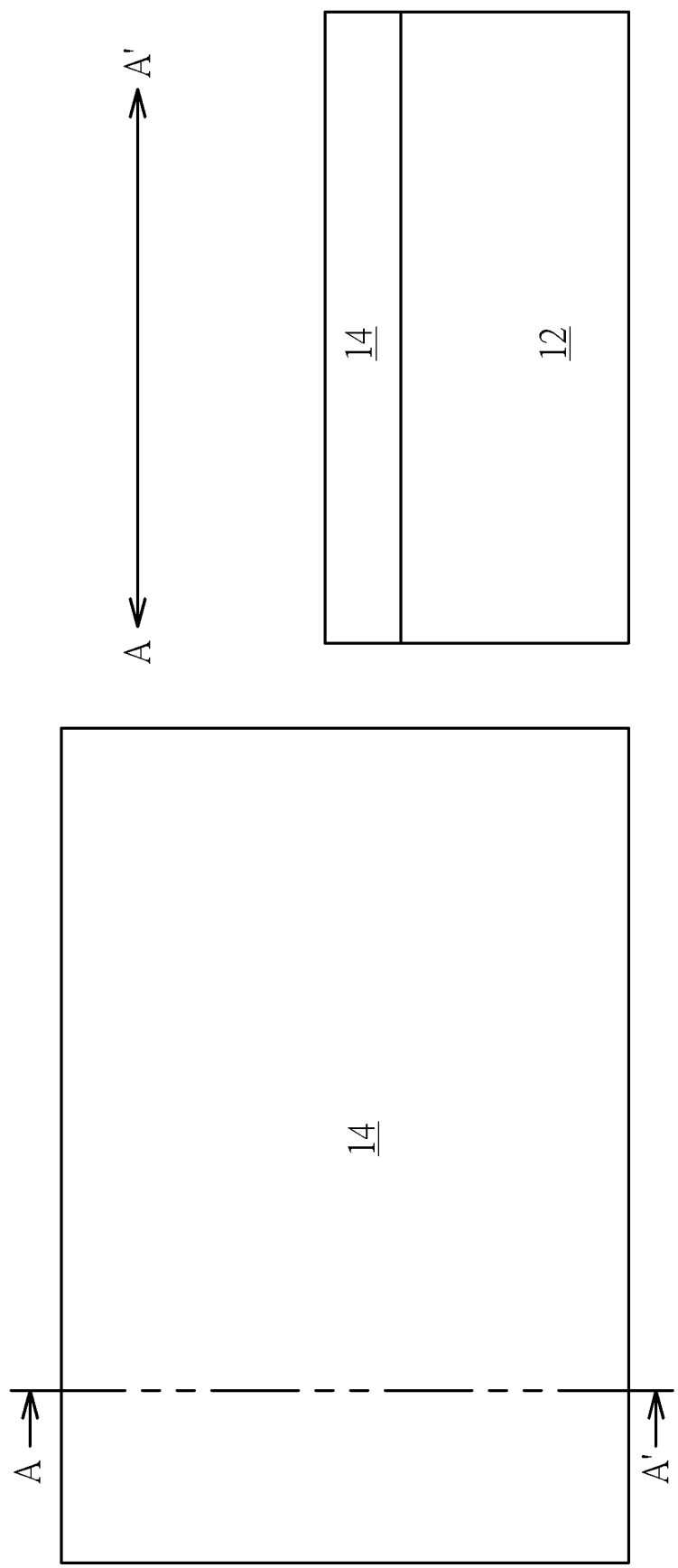
FIGS. 1-5 illustrate a method for fabricating semiconductor device according to an embodiment of the present invention.

Referring to FIG. 1, in which left portion of FIG. 1 illustrates a top view for fabricating a semiconductor device according to an embodiment of the present invention and right portion of FIG. 1 illustrates a cross-section view of the left portion of FIG. 1 taken along the sectional line AA'. As shown in FIG. 1, a substrate 12, such as a substrate composed of semiconductor material is provided, in which the semiconductor material could be selected from the group consisting of silicon, germanium, silicon germanium compounds, silicon carbide, and gallium arsenide. Active devices such as metal-oxide semiconductor (MOS) transistors, passive devices, conductive layers, and interlayer dielectric (ILD) layer (not shown) could also be formed on top of the substrate 12. More specifically, planar MOS transistors or non-planar (such as FinFETs) MOS transistors could be formed on the substrate 12, in which the MOS transistors could include transistor elements such as metal gates, source/drain regions, spacers, epitaxial layers, and contact etch stop layers (CESL). Preferably, the ILD layer could be formed on the substrate 12 and covering the MOS transistors and contact plugs could be formed in the ILD layer to electrically connect to the gate and/or source/drain region of MOS transistors. Since the fabrication of planar or non-planar transistors and ILD layer is well known to those skilled in the art, the details of which are not explained herein for the sake of brevity.

Next, an IMD layer 14 is formed on the ILD layer, in which the IMD layer 14 could include but not limited to for example nitrogen doped carbide (NDC) or silicon carbon nitride (SiCN). It should be noted that since the IMD layer 14 has not been patterned at this stage, the IMD layer 14 is disposed entirely on the surface of the lower level IMD layer and/or substrate 12 if viewed from a top view perspective.

Figure 2:
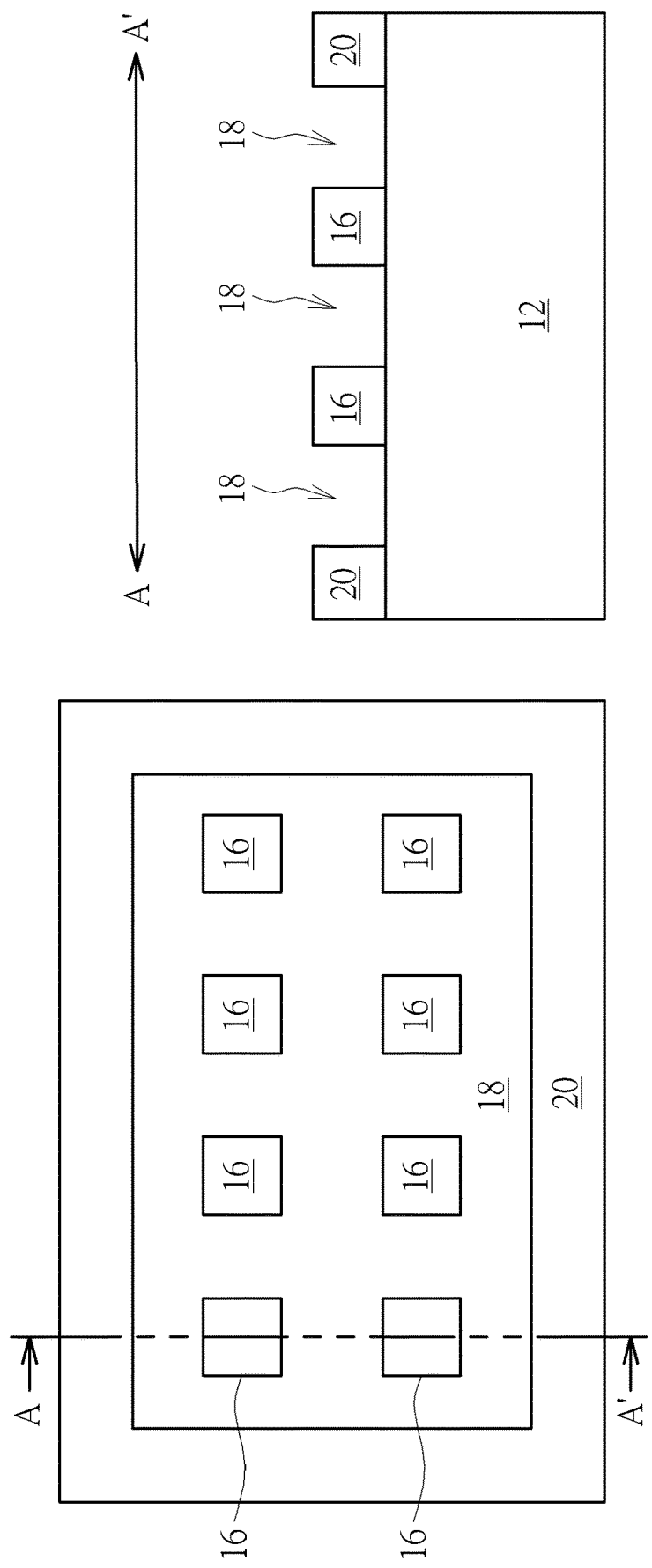

Referring to FIG. 2, in which left portion of FIG. 2 illustrates a method for fabricating semiconductor device following FIG. 1 according to an embodiment of the present invention and right portion of FIG. 2 illustrates a cross-section view of the left portion of FIG. 2 taken along the sectional line AA'. As shown in FIG. 2, a pattern transfer process is conducted to pattern the IMD layer 14 for forming a plurality of first IMD patterns 16, a trench 18, and a second IMD pattern 20. Specifically, the step for patterning the IMD layer 14 conducted at this stage could be accomplished by first forming a patterned mask (not shown) such as a patterned resist on the IMD layer 14, and then using the patterned mask as mask to remove part of the IMD layer 14 through etching process for patterning the IMD layer 14 into a plurality of first IMD patterns 16 on the substrate 12 or ILD layer, a trench 18 surrounding the first IMD patterns 16, and a second IMD pattern 20 surrounding the trench 18. If viewed from a top view perspective according to the left portion of FIG. 2, each of the first IMD patterns 16 formed at this stage preferably share equal size, each of the first IMD patterns 16 preferably include a quadrilateral such as a rectangle or square while the first IMD patterns 16 are even distributed or scattered within the trench 18 or arranged according to an array.

Figure 3:
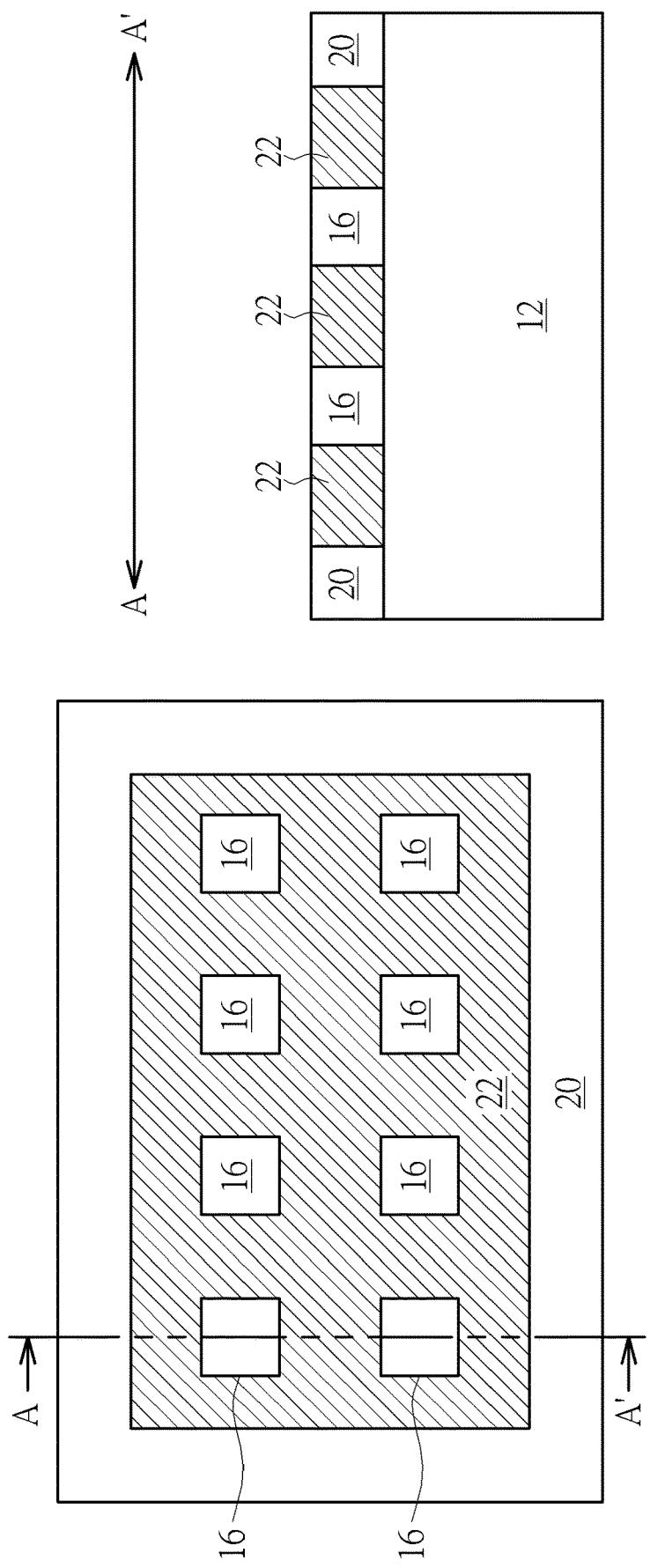

Referring to FIG. 3, in which left portion of FIG. 3 illustrates a method for fabricating semiconductor device following FIG. 2 according to an embodiment of the present invention and right portion of FIG. 3 illustrates a cross-section view of the left portion of FIG. 3 taken along the sectional line AA'. As shown in FIG. 3, a metal layer 22 is formed to fill the trench 18 entirely, in which the metal layer 22 while having the shape of the trench 18 could also be referred to as a patterned metal layer 22 that surrounds all of the first IMD patterns 16. Preferably, the entire patterned metal layer 22 surrounding the first IMD patterns 16 at this stage is at same electrical potential. In this embodiment, the metal layer 22 preferably includes copper (Cu), but could also include other materials including but not limited to for example tungsten (W), aluminum (Al), titanium aluminide (TiAl), cobalt tungsten phosphide, CoWP), or combination thereof.

Figure 4:
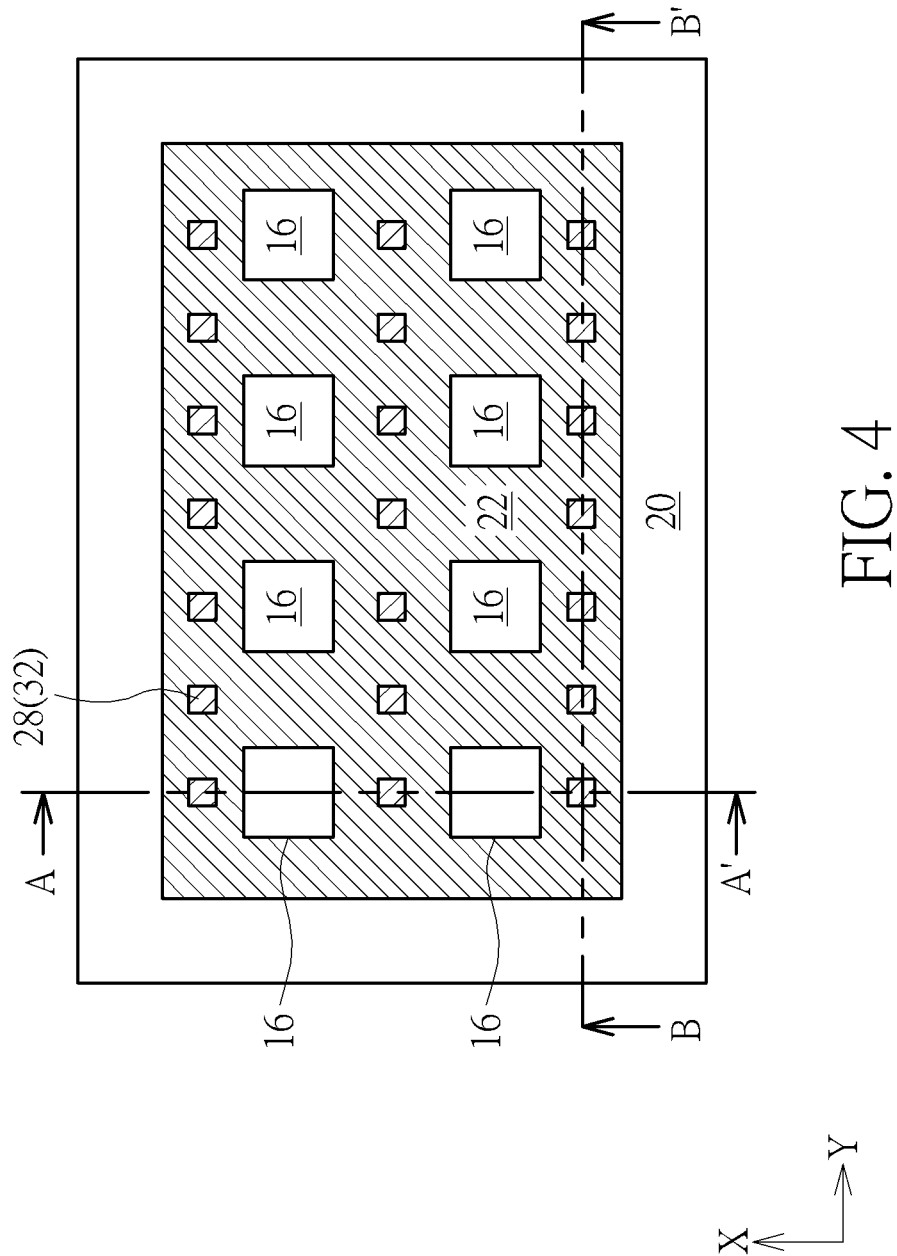
Figure 5:
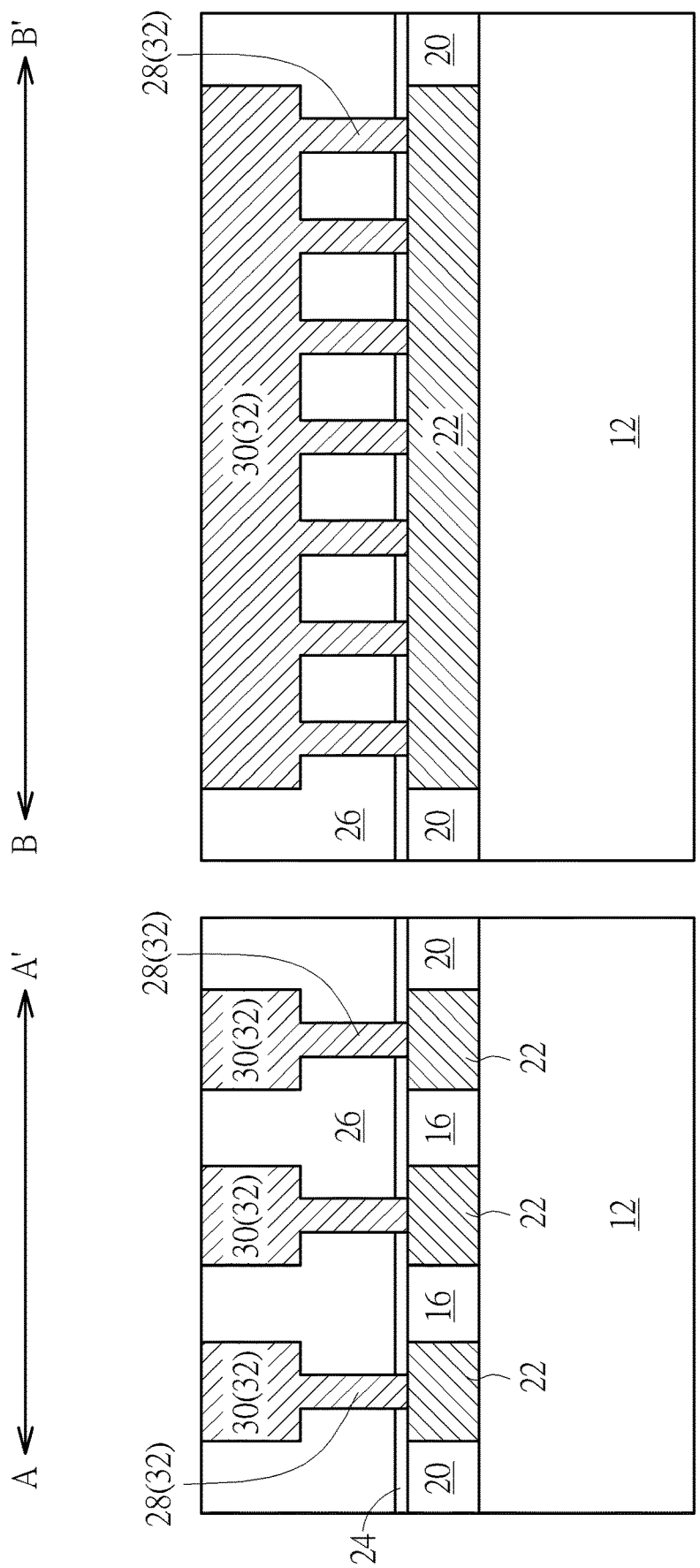
Figure 6:
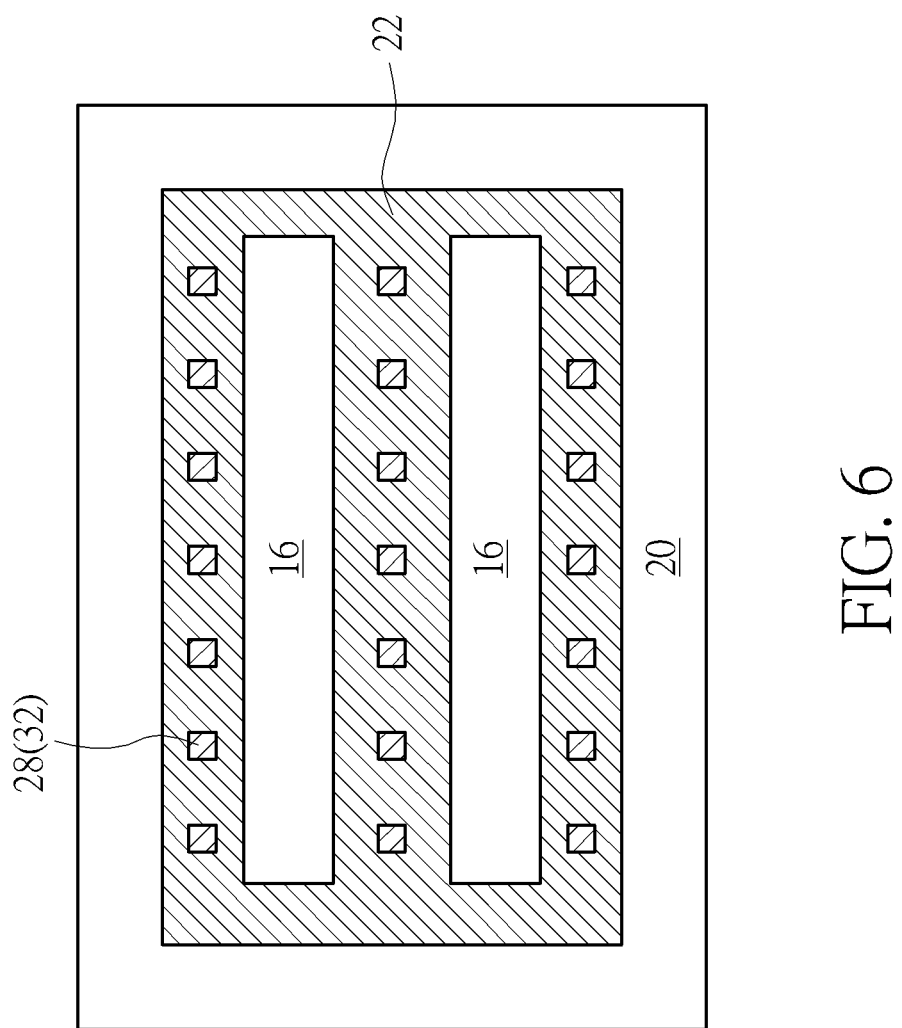
FIG. 6 illustrates a structural view of a semiconductor device according to an embodiment of the present invention.

Referring to FIGS. 4-6, in which FIG. 4 illustrates a method for fabricating semiconductor device following FIG. 3 according to an embodiment of the present invention, the left portion of FIG. 5 illustrates a cross-section view of FIG. 4 taken along the sectional line AA', the right portion of FIG. 5 illustrates a cross-section view of FIG. 4 taken along the sectional line BB', and FIG. 6 illustrates a top view for fabricating semiconductor device according to an embodiment of the present invention. As shown in FIGS. 4-5, a stop layer 24 and an IMD layer 26 are formed to cover the metal layer 22, the first IMD patterns 16, and the second IMD pattern 20, and one or more photo-etching process is conducted through a single damascene or dual damascene process to remove part of the IMD layer 26 and part of the stop layer 24 for forming a plurality of contact holes (not shown) exposing the metal layer 22 underneath, in which the contact holes preferably not overlapping any of the first IMD patterns 16 and second IMD pattern 20.

Next, conductive materials or metals including a barrier layer selected from the group consisting of titanium (Ti), titanium nitride (TiN), tantalum (Ta), and tantalum nitride (TaN) and a low resistance metal layer selected from the group consisting of W, Cu, Al, TiAl, and CoWP are deposited into the contact holes. Next, a planarizing process such as chemical mechanical polishing (CMP) is conducted to remove part of the barrier layer and low resistance metal layer for forming contact plugs or metal interconnections 32 made of via conductors 28 and trench conductors 30 electrically connecting the lower level metal layer 22. Since single damascene and dual damascene process are well known to those skilled in the art, the details of which are not explained herein for the sake of brevity. In this embodiment, the metal interconnections 32 preferably includes copper, the stop layer 24 preferably includes silicon nitride (SiN), and the IMD layer 26, first IMD patterns 16, and second IMD pattern 20 preferably include dielectric materials including but not limited to for example silicon oxide ($SiO_2$), tetraethyl orthosilicate (TEOS), nitrogen doped carbide (NDC), or silicon carbon nitride (SiCN).

It should be noted that to emphasize the arrangement of the via conductors 28 and lower level metal layer 22, only the via conductors 28 are shown in the top view in FIG. 4 while the trench conductors 30 are omitted for clarity purpose. Moreover, in addition to using the aforementioned patterning approach to form the first level patterned metal layer 22 within the patterned first IMD patterns 16 and second IMD pattern 20, it would also be desirable to apply the patterning approach for patterning the first level metal layer 22 to second level metal interconnections such as the trench conductors 30 or even higher level metal interconnections. Preferably, patterns formed by the second level metal interconnections through the aforementioned patterning process including metal layer patterns and/or IMD patterns could be having same patterns or different patterns as the first level metal interconnections, which are all within the scope of the present invention.

Referring again to FIGS. 4-6, FIGS. 4-6 further illustrate a structural view of a semiconductor device according to an embodiment of the present invention. As shown in FIGS. 4-6, the semiconductor device includes a patterned metal layer 22 disposed on the substrate 12, a plurality of via conductors 28 disposed on the patterned metal layer 22, a plurality of first IMD patterns 16 embedded in the patterned metal layer 22, and a second IMD pattern 20 surrounding the patterned metal layer 22.

In this embodiment, the via conductors 28 are arranged on the patterned metal layer 22 along a first direction (such as X-direction) in a top view and the first IMD patterns 16 are arranged between the via conductors 28 along the same first direction while not overlapping the via conductors 28, in which the first IMD patterns 16 are evenly distributed on the patterned metal layer 22 instead of clustering around the via conductors 28. Since the patterned metal layer 22 and the and the first IMD patterns 16 are disposed on the same level, the top surfaces of the patterned metal layer 22 and the first IMD patterns 16 are preferably coplanar according to a cross-section view. According to an embodiment of the present invention, if the first IMD patterns 16 on the first level are arranged along a first direction such as the X-direction, the IMD patterns on the second level could have either same or different arrangement as the first IMD patterns 16 on the first level. For instance, the IMD patterns on the second level could be arranged along the same X-direction as the first IMD patterns 16 or could be arranged along Y-direction, which are all within the scope of the present invention.

If viewed from a top view perspective, the patterned metal layer 22 preferably includes a quadrilateral, each of the via conductors 28 includes a square, and each of the first IMD patterns 16 includes a square, in which the area of each of the first IMD patterns 16 is slightly greater than the area of each of the via conductors 28. Nevertheless, according to other embodiments of the present invention, it would also be desirable to adjust the size of the first IMD patterns 16 so that the area of each of the first IMD patterns 16 could be equal to or less than the area of each of the via conductors 28, which are all within the scope of the present invention.

Moreover, as shown in FIG. 6, in contrast to the aforementioned embodiment of forming square first IMD patterns 16 while patterning the IMD layer 14 in FIG. 2, it would also be desirable to adjust the size or shape of the mask to form substantially rectangular first IMD patterns 16 in the trench. Next, processes from FIGS. 3-5 are conducted to form elements such as the patterned metal layer 22, stop layer 24, IMD layer 26, and metal interconnections 32, which is also within the scope of the present invention.

Figure 7:
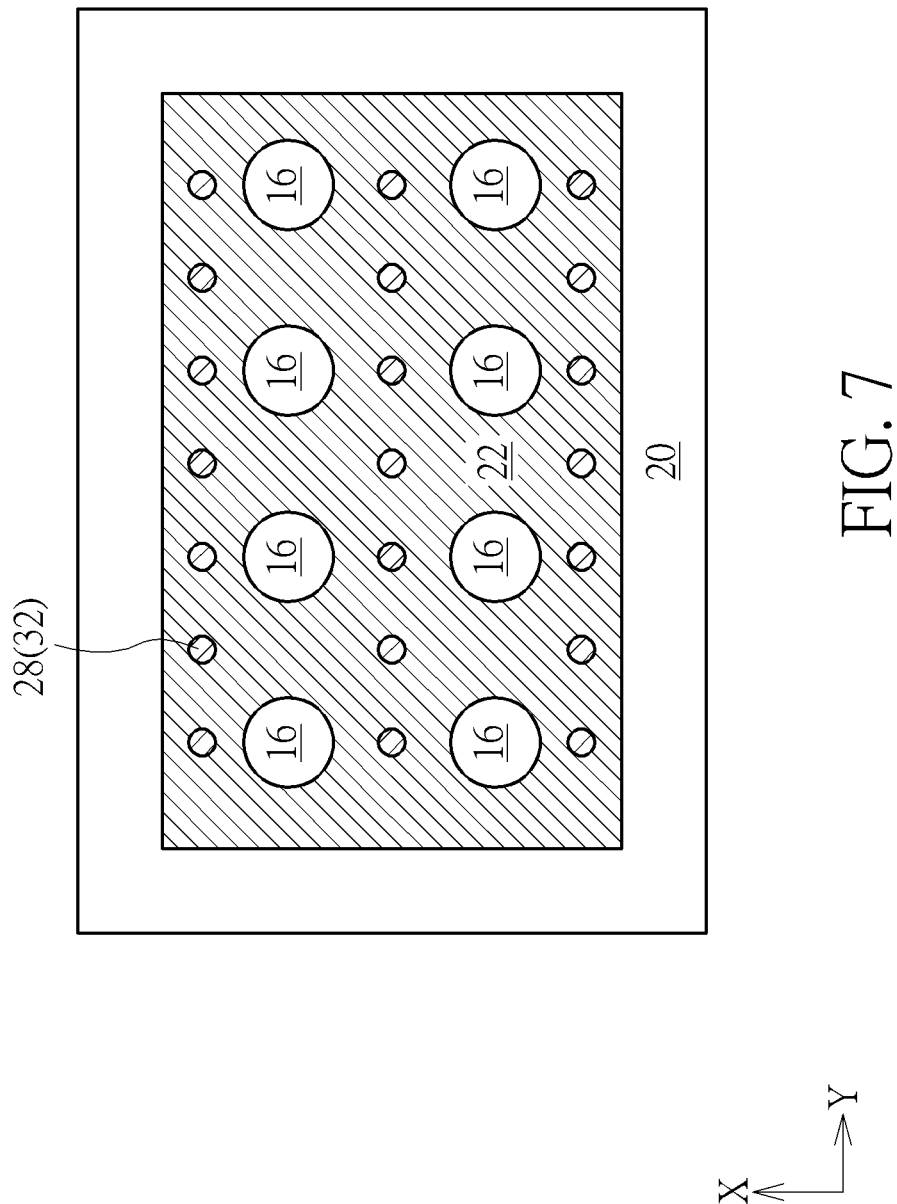
FIG. 7 illustrates a structural view of a semiconductor device according to an embodiment of the present invention.

Referring to FIG. 7, FIG. 7 illustrates a structural view of a semiconductor device according to an embodiment of the present invention. As shown in FIG. 7, in contrast to both the first IMD patterns 16 and via conductors 28 having square-shaped top view as shown in FIG. 4, it would also be desirable to adjust the pattern of mask used during formation of the aforementioned elements or carry out correcting step through optical proximity correction (OPC) process so that the shape of each of the first IMD patterns 16 and via conductors 28 could include a circle or substantially circular shape if viewed from a top view perspective, which is also within the scope of the present invention.

Overall, the present invention first forms a first IMD layer on the substrate and then pattern the first IMD layer to form a plurality of first IMD patterns, a trench surrounding the first IMD patterns, and a second IMD pattern around the trench. Next, a metal layer is deposited into the trench, a second IMD layer is formed, and a plurality of via conductors are formed in the second IMD layer to electrically connect the metal layer underneath. By using the above approach to embed IMD patterns evenly arranged according to an array within the metal layer, it would be desirable to balance or relieve the stress between lower level and higher level metal interconnect structures without only reducing stress locally or concentrated around a single via conductor. Ideally, it would be desirable to improve the issue of cracks generated not only in dense region but also in all other areas of metal interconnect structure as a result of uneven stress.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
    forming a first inter-metal dielectric (IMD) layer on a substrate;
    patterning the first IMD layer to form first IMD patterns on the substrate, a trench surrounding the first IMD patterns, and a second IMD pattern surrounding the trench;
    forming a metal layer in the trench to surround the first IMD patterns;
    forming a second IMD layer on the first IMD patterns, the metal layer, and the second IMD pattern; and
    forming via conductors in the second IMD layer, wherein the via conductors not overlapping the first IMD patterns.

2. The method of claim 1, wherein top surfaces of the metal layer and the first IMD patterns are coplanar.

3. The method of claim 1, wherein the metal layer comprises copper, aluminum, tungsten, titanium aluminide, or cobalt tungsten phosphide.

4. The method of claim 1, wherein the via conductors are arranged on the metal layer along a first direction in a top view.

5. The method of claim 4, wherein the first IMD patterns are arranged between the via conductors along the first direction in a top view.

6. The method of claim 1, wherein a shape of the metal layer comprises a quadrilateral in a top view.

7. The method of claim 1, wherein a shape of each of the via conductors comprises a square or a circle in a top view.

8. The method of claim 1, wherein a shape of each of the first IMD patterns comprises a square or a circle in a top view.

9. The method of claim 1, wherein a shape of each of the first IMD patterns comprises a rectangle in a top view.

* * * * *